(12) United States Patent
Nagahara et al.

(10) Patent No.: US 6,879,143 B2
(45) Date of Patent: Apr. 12, 2005

(54) METHOD OF SELECTIVELY ALIGNING AND POSITIONING NANOMETER-SCALE COMPONENTS USING AC FIELDS

(75) Inventors: Larry A. Nagahara, Phoenix, AZ (US); Islamasha Amlani, Gilbert, AZ (US); Justin Charles Lewenstein, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 378 days.

(21) Appl. No.: 10/123,740

(22) Filed: Apr. 16, 2002

(65) Prior Publication Data

US 2003/0194940 A1 Oct. 16, 2003

(51) Int. Cl.[7] .......................... G01N 27/00; H01L 21/00
(52) U.S. Cl. .................................. 324/71.1; 438/800
(58) Field of Search .................. 438/48–49, 800; 324/71.1; 435/6; 205/775, 776.5, 777.5

(56) References Cited

U.S. PATENT DOCUMENTS

| | | | |
|---|---|---|---|
| 6,536,106 B1 * | 3/2003 | Jackson et al. | ............... 29/872 |
| 2003/0087277 A1 * | 5/2003 | Fritzsche et al. | ............. 435/6 |
| 2004/0014106 A1 * | 1/2004 | Patno et al. | .................... 435/6 |
| 2004/0055892 A1 * | 3/2004 | Oh et al. | ................... 205/109 |

FOREIGN PATENT DOCUMENTS

| EP | 0 987 653 A2 | 3/2000 |
|---|---|---|
| WO | WO 98/28320 | 7/1998 |
| WO | WO 02/26624 A1 | 4/2002 |

OTHER PUBLICATIONS

Lee et al., "Superimposed AC– and DC Electric Field Guided Deposition of a Single DNA Molecule Along a Microfabricated Gap", 2003, IEEE–NANO 2003, pp. 729–732 vol. 2.*

Chung et al., "Fabrication of Single Multi–walled Carbon Nanotube Array with a Composite Electric Field Guided Assembly Method", 2003, IEEE–NANO 2003, pp. 331–334 vol. 2.*

"Aligning single–wall carbon nanotubes with an alternating–current electric field," X.Q. Chen et al., Applied Physics Letters, vol. 78, No. 23, Jun. 4, 2001, pp. 3714–3716.

"Electric–field assisted assembly and alignment of metallic nanowires," Peter A. Smith et al, Applied Physics Letters, vol. 77, No. 9, Aug. 28, 2000, pp. 1399–1401.

* cited by examiner

*Primary Examiner*—Evan Pert

(57) ABSTRACT

An improved and novel method of selectively aligning and positioning nanometer-scale components using AC fields. The method provides for more precise manipulation of the nanometer-scale components in bridging test electrodes including the steps of: providing an alternating current (AC) field at a single electrode or between a plurality of electrodes to create an electric field in an environment containing nanometer-scale components. The electric field thereby providing for the aligning and positioning of the nanometer-scale components to the desired location.

11 Claims, 3 Drawing Sheets

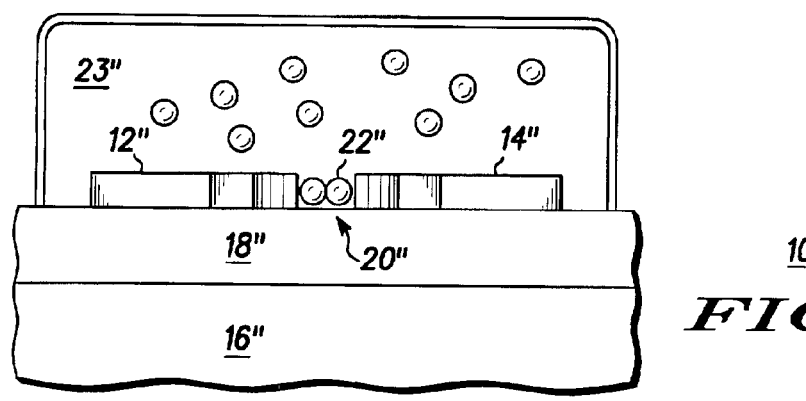
FIG. 4
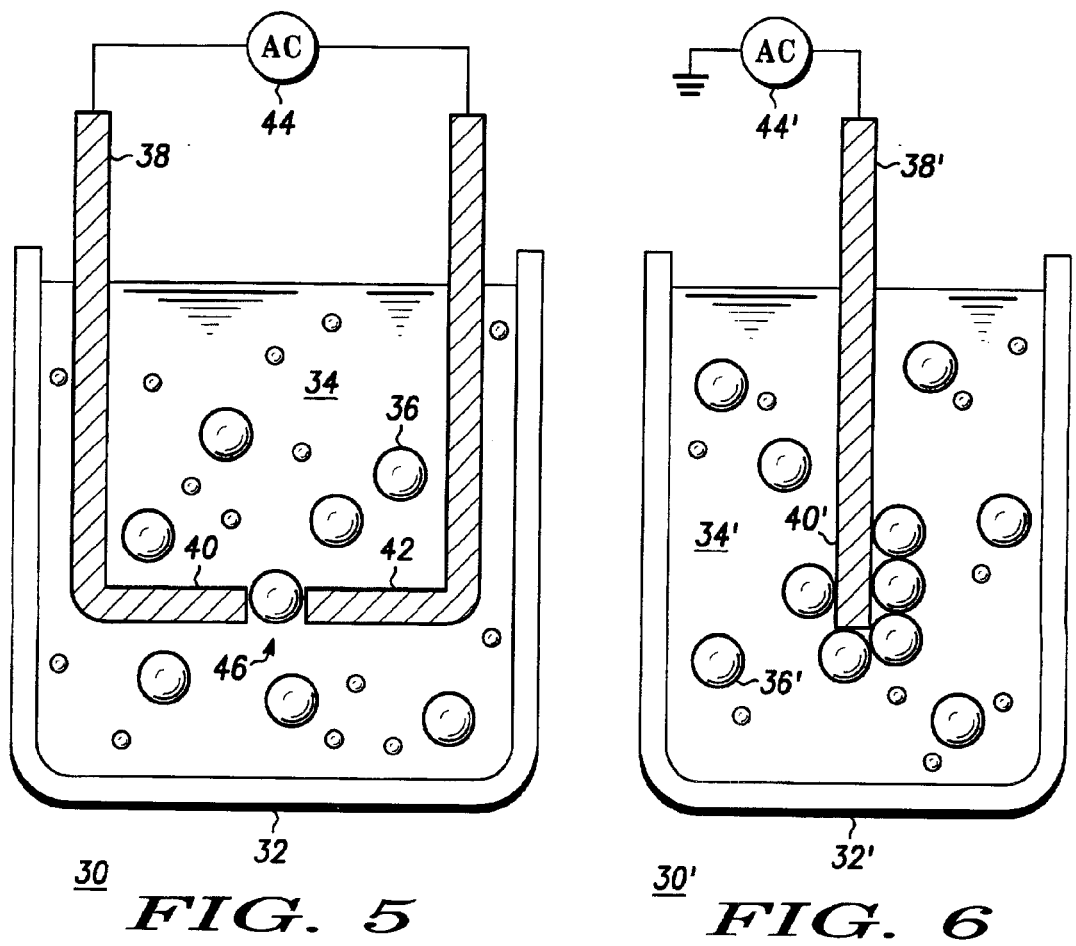
FIG. 5
FIG. 6

METHOD OF SELECTIVELY ALIGNING AND POSITIONING NANOMETER-SCALE COMPONENTS USING AC FIELDS

FIELD OF THE INVENTION

The present invention relates to an assembly technique to facilitate the transport measurements of electronic molecules, and more particularly to a method of selectively aligning and positioning and assembling nanometer-scale components using alternating current (AC) electric fields.

BACKGROUND OF THE INVENTION

Molecular electronics is a rapidly growing field and is providing for a means to overcome the miniaturization limits that Si technology is approaching. Molecules and nanometer-scale components, with unique functionality are considered possible candidates for molecular electronics. One of the challenges facing molecular electronics is communicating the information/functionality of the molecules to the "outside" world. In order to accomplish this, a simple and robust procedure needs to be developed to selectively place and "wire" nanometer-scale components, such as molecules, to metal electrodes. A rapid screening method to "hook-up" candidate molecules to be tested and determine their functionality is also considered a crucial step toward molecular electronics.

Assessing the feasibility of molecular electronics requires the screening of a large number of nano-scale components, for their potential applications. The main challenge is to make electrical contact to molecules to determine their transport properties. For instance, typical dimensions of molecular systems are well below the resolution limits of electron beam lithography. Although various fabrication approaches have been proposed, a quick and simple way to make measurements on a small number of molecules still remains a challenge.

One of the approaches for transport measurements in molecular electronic technology uses electrostatic trapping to bridge electrodes in a controlled way with a single conducting nanoparticle. In electrostatic trapping, nanoparticles are polarized by an applied direct current (DC) electric field and are attracted to the gap between the electrodes where the field is maximum. One approach, for example, teaches the use of a DC bias to attract DNA, carbon nanotubes, or other nanoparticles to a pair of electrodes. The use of a DC bias as the applied electric field provides for the attraction of charged molecules, including unwanted contaminants, to bridge the electrodes and results in non-specific selectivity to the electrodes.

Accordingly, it is an object of the present invention to provide for a method of achieving greater control and greater selectivity with respect to placement of nanometer-scale components on a single electrode, or between a plurality of electrodes, in comparison to what was previously achieved with DC fields.

It is another object of the present invention to provide for a method of selectively aligning and positioning nanometer-scale components using AC fields.

It is yet another object of the present invention to provide for a method for selectively aligning and positioning nanometer-scale components utilizing AC fields which provides for more precise manipulation of the nanometer-scale components in bridging test electrodes.

SUMMARY OF THE INVENTION

These needs and others are substantially met through provision of a method for selectively aligning and positioning nanometer-scale components utilizing AC fields. The method provides for more precise manipulation of the nanometer-scale components in bridging test electrodes including the steps of: providing an alternating current (AC) field at an at least one electrode to create an electric field in an environment containing nanometer-scale components. The electric field thereby providing for the attraction of the nanometer-scale components to the desired location.

BRIEF DESCRIPTION OF THE DRAWINGS

The foregoing and further and more specific objects and advantages of the present invention will become readily apparent to those skilled in the art from the following detailed description of a preferred embodiment thereof taken in conjunction with the drawings, in which:

FIG. 4 illustrates in simplified cross-sectional view, an alternate method of selectively aligning and positioning a plurality of nanometer-scale components according to the present invention;

FIG. 5 illustrates in simplified cross-sectional view, an alternate method of selectively aligning and positioning nanometer-scale components in a solution using two electrodes according to the present invention;

FIG. 6 illustrates in simplified cross-sectional view, an alternative method of selectively aligning and positioning nanometer-scale components in a solution using a single electrode according to the present invention.

DETAILED DESCRIPTION OF THE PREFERRED EMBODIMENTS

Disclosed is a molecular assembly technique using an alternating current (AC) electric field to facilitate selective alignment and transport measurements of electronic nanometer-scale components. The term nanometer-scale components, for purposes of this disclosure, is intended to include nanoparticles, nanotubes, nanowires, nanorods, synthetic polymers, synthetic molecules, and biomolecules, including DNA molecules, proteins, or the like. With the appropriate choice of amplitude and frequency, the use of an AC bias dramatically enhances the placement of desired nanometer-scale components over other contaminant species in the solution, such as in a solution containing carbon nanotubes and organic or inorganic contaminants.

Figure 1:
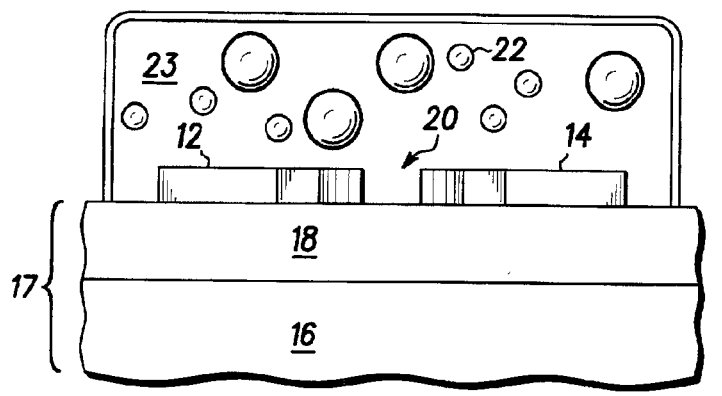
FIGS. 1 and 2 illustrate in a simplified cross-sectional views, steps in the method of selectively aligning and positioning a nanometer-scale component according to the present invention.
Figure 2:
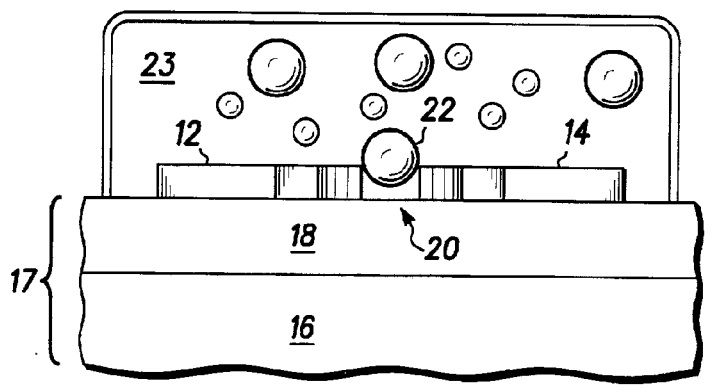

Referring now to FIGS. 1–2 illustrated in simplified cross-sectional views is an assembled structure utilized for selective alignment of nanometer-scale components according to the present invention and the method of using the structure to provide for selective alignment. More specifically, illustrated in FIG. 1 is a first step in the method of selectively aligning and positioning nanometer-scale components, wherein provided is a molecular assembly 10 including two or more electrodes (discussed presently). Assembly 10 in this particular embodiment includes a substrate 17, comprised of a semiconductor material 16 which has been coated with an insulating material 18. It should be understood that anticipated by this disclosure is an alternate embodiment in which substrate 17 is formed as a single layer of insulating material, such as glass plastic ceramic, or any dielectric material that would provide insulating properties. By forming substrate 17 of an insulating material, the need for a separate insulating layer formed on top of a semiconductive layer, or conductive layer, such as layer 18 of FIG. 1, is eliminated.

In the embodiment illustrated in FIGS. 1–2, semiconductor material 16 is disclosed as comprised of any semiconductor material well known in the art, such as silicon (Si), gallium arsenide (GaAs), germanium (Ge), silicon carbide (SiC), indium arsenide (InAs), or the like. Insulating material 18 is disclosed as comprised of any material that provides insulative properties such silicon oxide ($SiO_2$), silicon nitride (SiN), or the like. Together semiconductor material 16 and insulating material 18 form substrate 17 as illustrated in FIGS. 1–2. In this specific example, assembly 10 includes a first electrode 12 and a second electrode 14 formed on an uppermost surface of insulating material 18. Fabrication of metal electrodes 12 and 14 is carried out using a combination of photolithography and electron beam lithography on an oxidized silicon substrate 17. Fine features of electrodes 12 and 14 are patterned by a standard PMMA resist process using standard liftoff technique. Electrodes 12 and 14 are formed to define therebetween a gap 20 and provide for the application of an AC electric field (as illustrated in FIG. 2).

During operation, as illustrated in FIG. 2, an AC field is applied between electrodes 12 and 14 thereby causing movement of a nanometer-scale component 22 suspended within an aqueous environment 23 toward gap 20 where the field and/or field gradient is the strongest. It should be understood that anticipated by this disclosure is the use of any environment, such as aqueous or gaseous in which nanometer-scale components are contained. More specifically, FIG. 2 illustrates a 80 nm Au nanoparticle 22 trapped between electrodes 12 and 14. The resistance of such a contact usually varies from 1 to 3 kΩ. This represents the case when the nanoparticle 22 size is larger than gap 20. As soon as a nanoparticle 22 bridges gap 20, the electric field in gap 20 is reduced which prevents accumulation of additional particles.

Immediately prior to the trapping of nanoparticle 22 with the application of an AC field, substrate 17 is cleaned for 30 minutes in ultraviolet (UV) ozone, followed by a 20 minute soak in ethanol to remove oxidized Au. Nanoparticle assembly is carried out on a probe station. A drop (~5 μL) of commercially available Au colloid in water is dispensed on the substrate and an AC bias 24 (0.5–2.5 V, peak-to-peak) ranging from 1 MHz to 10 MHz is applied to electrodes 12 and 14 using a function generator. It should be understood that the amplitude of the AC bias, frequency and trapping time may vary, dependent upon the nature and concentration of the nanometer-scale components and the dielectric environment in which the nanometer-scale components are contained. Trapping time in this particular example is typically between 5 and 30 seconds. In principle, one may use a direct current (DC) field to trap nanoparticles in the gap, but such DC field is not the field of choice herein as use of a DC field will result in a success rate that is much lower as compared to an AC field. Under the influence of an AC field, nanoparticle(s) 22 experience a dielectrophoretic force that pulls them in the direction of maximum field gradient found in gap 20. Using this technique, nanoparticle 22, or a plurality of nanoparticles, typically ranging in size from 40 to 100 nm, are trapped in gap 20 with a yield of almost 100%. After nanoparticle trapping, assembly 10 is placed in a beaker with high purity deionized water (18 MΩcm) for 1 minute and then spun dry. The purpose of rinsing assembly 10 is for the removal of excess solution and nanometer-scale components.

Figure 3:
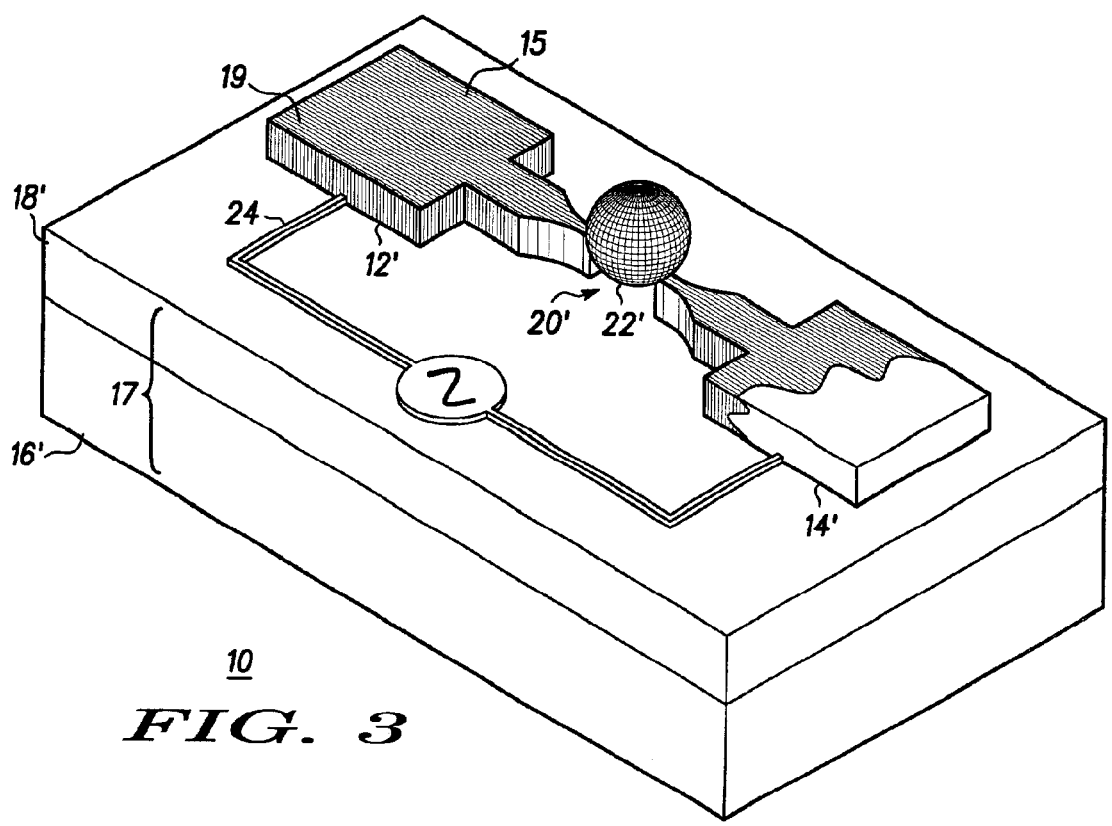
FIG. 3 illustrates in a simplified isometric view the selective alignment of a nanometer-scale component according to the method of selective alignment of the present invention.

Referring now to FIG. 3, illustrated is an alternate embodiment of device 10 of FIGS. 1–2, including an optional self-assembled monolayer (SAM), referenced device 10'. It should be noted that all components of FIG. 3 that are similar to the components illustrated in FIGS. 1–2, are designated with similar numbers, having a prime added to indicate the different embodiment. In addition, it should be understood that while the formation of a SAM layer is described herein, anticipated by this disclosure is any process that includes a means of affixing a test molecule to a surface.

Device 10' includes an optional self-assembled monolayer (SAM) 15. Monolayer 15 is formed of a test nanometer-scale component of interest, more specifically a molecule 19, on the pair of pre-patterned electrodes 12' and 14', including a gap 20' formed therebetween. In this particular embodiment molecules 19 which comprise SAM 15 are formed on electrode 12' and 14' of an identical molecule type, meaning molecules 19 which form SAM 15 on top of electrode 12' are the same type as molecules which form SAM 15 on top of electrode 14'. Alternatively, molecules which comprise the SAM may be formed of differing molecule types on the electrodes, meaning the molecules that form a SAM on top of one electrode, differ from the molecules that form a SAM on top of the other electrode. It is additionally anticipated that optional SAM 15 can be formed on a single electrode.

In this particular embodiment, electron beam lithography is utilized to fabricate gold electrodes 12' and 14' defining a gap 20' therebetween, ranging from 40 to 100 nm. Larger features of electrodes 12' and 14' including bonding pads (not shown) are defined using photolithography to form a relatively thicker Au layer to facilitate bonding. Molecules 19 which comprise SAM 15 have thiol terminations that are known to have a high affinity for gold (Au), thus a thin layer of gold (Au) (20 nm) is utilized for the fine features of electrodes 12' and 14'. In this particular embodiment illustrated in FIG. 3, the use of a titanium (Ti) adhesion layer has been intentionally avoided during metal evaporation in order to preclude ambiguity about the Au electrode-nanoparticle contact. In principle, the choice of metal and the inclusion of various metal adhesion layers will depend on the attachment moiety of the molecule that binds it to electrodes 12' and 14'. An alternative embodiment of a self-assembled monolayer (SAM) is anticipated by this disclosure in which, a SAM is formed directly on a nanometer-scale component prior to bridging the electrode. This fabrication of a SAM directly on the surface of the nanometer-scale components would eliminate the need for the formation of SAM 15 as illustrated in FIG. 3.

As illustrated in FIG. 3, the application of an AC electric field 24 provides for the bridging of gap 20' formed between electrodes 12' and 14' with a nanometer-scale component, which in this particular embodiment is exemplified by a metallic nanoparticle 22'. Similar to the embodiment described with respect to FIGS. 1 and 2, this approach alleviates the need for fabricating extremely narrow gaps (1–2 nm) which is typically required for the direct measurement of electronic nanometer-scale components. The process, as described, results in two separate arrays of molecules connected in series via nanoparticles.

During fabrication, prior to SAM 15 formation, substrate 17' is first cleaned using UV ozone treatment and an ethanol soak as described previously and then immediately transported into a glove box. Self-assembly of the test molecule to Au electrodes 12' and 14' is carried out in a glass sealing vial that has been cleaned by a piranha solution (3:1 $H_2SO_4:H_2O_2$). A 1.0 mM solution of the test nanometer-scale component in 10 mL of freshly distilled tetrahydrofuran (THF) was treated with 10 $\mu$L of Ar sparged ammonium hydroxide to promote deprotection of the thiol. Assembly 10' is placed in the solution and SAM 15 formation is allowed to proceed at room temperature for 18–24 hours. Next, assembly 10' is removed form the glass vial and rinsed with freshly distilled THF. Finally, assembly 10' is transported out of the glove box and immediately used for AC trapping of the Au colloids 22' and subsequent electrical measurements.

In yet another example, as illustrated in FIG. 4, frequently, two or more nanoparticles 22" are found bridging gap 20". It should be noted that all components of FIG. 4 that are similar to the components illustrated in FIGS. 1–3, are designated with similar numbers, having a double prime added to indicate the different embodiment. The resistance of this type of Au electrode nanoparticle assembly 10" typically varies from 100 k$\Omega$ to hundreds of M$\Omega$. When the nanoparticle has a size that is smaller than the formed gap 20", a larger number of nanoparticles 22" will cluster in the gap region 20".

Referring now to FIG. 5, illustrated in simplified cross-sectional view is yet another method of selectively aligning and positioning nanometer-scale components according to the present invention. More specifically, illustrated in FIG. 5 is an assembly 30, shown submerged in a container 32 which holds a solution 34 containing a plurality of nanometer-scale components 36. Assembly 30 includes probes 38 which have formed as a part thereof a first electrode 40 and a second electrode 42. Probes 38 are in electrical communication with a means for providing an AC field 44. During operation, the means for delivering the AC bias 44 delivers an electric field to electrodes 40 and 42. Again, it should be understood that the amplitude of AC bias 44, frequency and trapping time may vary, dependent upon the nature and concentration of the nanometer-scale components 36 and the dielectric environment in which nanometer-scale components 36 are contained. Under the influence of AC field 44, nanoparticle(s) 36 experience a dielectrophoretic force that pulls them in the direction of maximum field strength found in a gap 46 formed between electrodes 40 and 42.

Referring now to FIG. 6, illustrated in simplified cross-sectional view is another method of selectively aligning and positioning nanometer-scale components according to the present invention in which a single probe assembly 30' is shown submerged in a container 32' which holds a solution 34' containing a plurality of nanometer-scale components 36'. It should be noted that all components of FIG. 6 that are similar to the components illustrated in FIGS. 1–3, are designated with similar numbers, having a prime added to indicate the different embodiment. Assembly 30' includes a single probe 38' which has formed a single electrode 40' formed generally similar to the electrodes of FIGS. 1–2. Probe 38' is in electrical communication with a means for providing an AC field 44'. During operation, the means for delivering the AC bias 44' delivers an electric field to electrodes 40'. Again, it should be understood that the amplitude of AC bias 44', frequency and trapping time may vary, dependent upon the nature and concentration of the nanometer-scale components 36' and the dielectric environment in which nanometer-scale components 36' are contained. Under the influence of AC field 44', nanoparticle(s) 36' experience a dielectrophoretic force that pulls them in the direction of probe 38' and more particularly electrode 40'. Using this technique, nanoparticle 36', or a plurality of nanoparticles, are formed on probe 38'.

Figure 7:
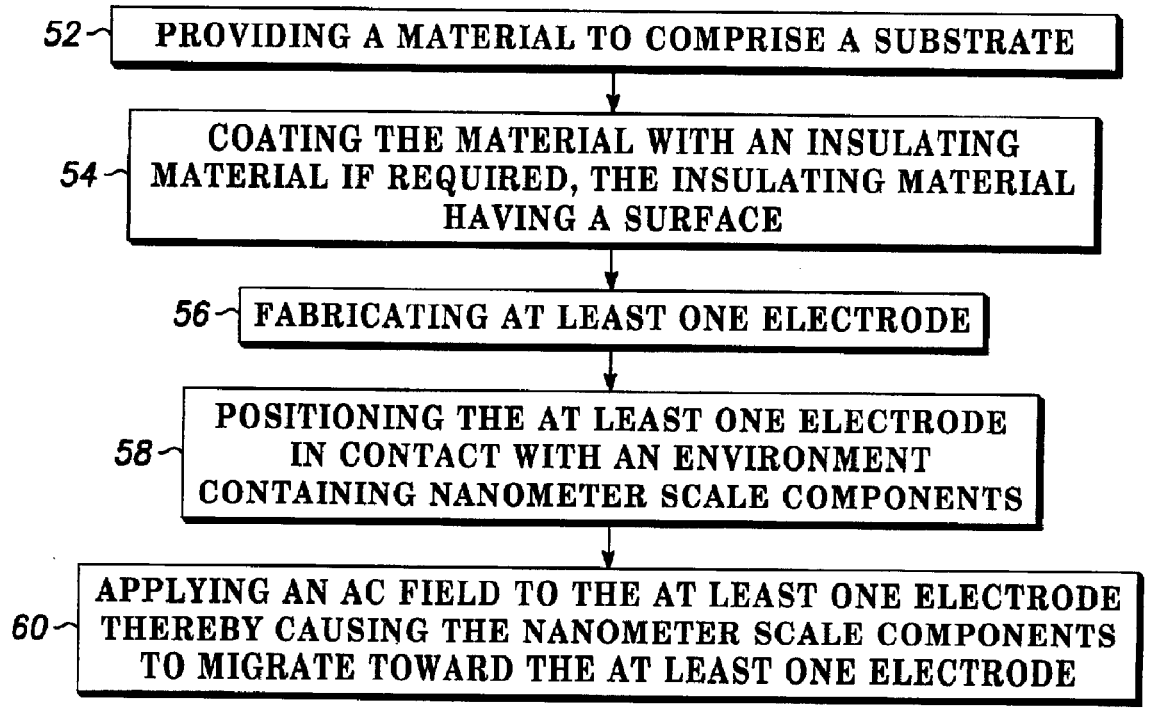
FIG. 7 illustrates a simplified flow chart of the steps in the method of selectively aligning and positioning nanometer-scale components according to the present invention.

Referring now to FIG. 7, illustrated in simplified flow diagram are the steps in the method of selectively aligning and positioning nanometer-scale components 50 according to the present invention. Initially, a substrate material is provided 52, and coated with an insulating material if required having a surface 54. Next, at least one electrode, generally similar to the electrodes described in FIGS. 1–6 are formed on the substrate 56 using standard silicon processing techniques. The step of forming the electrodes 56 may include the fabrication of a gap therebetween when at least two electrodes are formed, as previously described. During the selective alignment process, the at least one electrode is positioned in contact with an environment containing nanometer-scale components 58. An AC field is applied 60 to the at least one electrode thereby causing the nanometer-scale components contained within the solution to accumulate at the at least one electrode, or bridge a gap formed therebetween two or more electrodes. Transport measurements are thereafter taken.

In conclusion, we present herein an assembly technique to allow for transport measurements of electronic nanometer-scale components. Previous active placement methods have been reported and include applying a DC bias to trap nanometer-scale components between two electrodes. Since a constant DC bias is applied, any species with the appropriate inherent charge will be attracted to the electrodes as well as species diffusing due to electroosmotic forces. In many instances, the species of interest cannot be purified easily or obtained at a reasonable concentration. Described herein is a new approach that is relatively simple and uses AC trapping of nanometer-scale components. This process is capable of aligning and positioning nanometer-scale components. With the appropriate choice of amplitude and frequency, the use of an AC bias dramatically enhances the placement of desired nanometer-scale components over other contaminant species in the solution. Thus, this technique potentially allows for a quick and easy way to characterize a variety of electronic nanometer-scale components.

While we have shown and described specific steps in the method of selectively aligning and positioning nanometer-scale components according to the present invention, further modifications and improvements to the process will occur to those skilled in the art. We desire it to be understood, therefore, that this invention is not limited to the particular steps shown and we intend in the appended claims to cover all modifications that do not depart from the spirit and scope of this invention.

What is claimed is:

1. A method for selectively aligning and positioning nanometer-scale components comprising the steps of:

providing a substrate material;

patterning two or more electrodes having a gap formed therebetween on an uppermost surface of the substrate material;

providing an environment in contact with the two or more electrodes, the environment having contained therein nanometer-scale components;

providing an alternating current (AC) field between the two or more electrodes, thereby trapping the nanometer-scale components in the gap formed therebetween the two or more electrodes.

2. A method for selectively aligning and positioning nanometer-scale components as claimed in claim 1 wherein the step of providing a substrate includes providing a substantially planar substrate formed of a semiconductor material.

3. A method for selectively aligning and positioning nanometer-scale components as claimed in claim 1 wherein the step of patterning two or more electrodes having a gap formed therebetween on an uppermost surface of the substrate material includes patterning using lithography techniques.

4. A method for selectively aligning and positioning nanometer-scale components as claimed in claim 2 further including the step of fabricating on an uppermost surface of at least one of the two or more electrodes a self-assembled monolayer (SAM) of a test nanometer-scale component.

5. A method for selectively aligning and positioning nanometer-scale components comprising the steps of:
providing a semiconductor material;
forming on an uppermost surface of the semiconductor material, an insulating layer;
patterning two or more electrodes having a gap formed therebetween on an uppermost surface of the insulating material;
forming on an uppermost surface of at least one of the two or more electrodes, a self-assembled monolayer (SAM) of a test molecule;
providing an environment in contact with the two or more electrodes, the environment having contained therein nanometer-scale components;
providing an alternating current (AC) field between the two or more electrodes to create an electric field, thereby trapping at least one nanometer-scale component matching the test nanometer-scale component in the gap formed therebetween the two or more electrodes.

6. A method for selectively aligning and positioning nanometer-scale components as claimed in claim 5 wherein the step of providing a semiconductor material includes the step of providing a semiconductor material formed of one of silicon (Si), gallium arsenide (GaAs), germanium (Ge), silicon carbide (SiC), indium arsenide (InAs).

7. A method of selectively aligning and positioning nanometer-scale components as claimed in claim 6 wherein the step of forming on an uppermost surface of the semiconductor material, an insulating layer includes forming an insulating layer comprised of at least one of silicon dioxide ($SiO_2$) and silicon nitride (SiN).

8. A method of selectively aligning and positioning nanometer-scale components as claimed in claim 7 wherein the step of patterning two or more electrodes having a gap formed therebetween includes patterning using lithography technique.

9. A method of selectively aligning and positioning nanometer-scale components as claimed in claim 8, wherein the step of forming a self-assembled monolayer (SAM) of a test molecule includes forming a SAM on a nanometer-scale component contained within the environment.

10. A method of selectively aligning nanometer-scale components as claimed in claim 9 wherein the step of providing a solution containing nanometer-scale components in contact with the two or more electrodes includes providing a solution containing colloidal metal nanometer-scale components.

11. A method of selectively aligning and positioning nanometer-scale components as claimed in claim 10 wherein the step of providing an alternating current (AC) field between the two or more electrodes to create an electric field, thereby trapping at least one nanometer-scale component matching the test nanometer-scale component in the gap formed therebetween the two or more electrodes includes trapping a plurality of nanometer-scale components to bridge the gap.

* * * * *